United States Patent [19]

Ibuchi et al.

[11] Patent Number: 5,140,378
[45] Date of Patent: Aug. 18, 1992

[54] IMAGE FORMING APPARATUS WITH A PRESSURE DEVELOPMENT UNIT

[75] Inventors: Yoshiaki Ibuchi, Nara; Kazuhiro Matsuyama, Ikoma, both of Japan

[73] Assignee: Sharp Kabushiki Kaisha, Japan

[21] Appl. No.: 511,176

[22] Filed: Apr. 19, 1990

[30] Foreign Application Priority Data

Apr. 24, 1989 [JP] Japan .................................. 1-104161
Jun. 19, 1989 [JP] Japan .................................. 1-156486

[51] Int. Cl.$^5$ ............................................. G03G 15/20
[52] U.S. Cl. ................................. 355/295; 100/168; 355/27; 355/311
[58] Field of Search ............... 355/27, 277, 311, 282, 355/295, 100, 106; 100/160, 168, 176; 354/304

[56] References Cited

U.S. PATENT DOCUMENTS

| | | | |
|---|---|---|---|
| 3,885,869 | 5/1975 | James ................................. 355/311 |
| 4,579,333 | 4/1986 | Aoki .................................. 355/311 X |
| 4,926,358 | 5/1990 | Tani et al. ......................... 355/311 X |
| 4,931,826 | 6/1990 | Lucht et al. ...................... 355/72 X |
| 4,945,374 | 7/1990 | Yamamoto et al. .............. 355/27 X |
| 5,089,838 | 2/1992 | Yamamoto et al. .............. 354/304 |

FOREIGN PATENT DOCUMENTS 0050866 3/1987 Japan .................................. 355/277

Primary Examiner—A. T. Grimley
Assistant Examiner—Christopher Horgan
Attorney, Agent, or Firm—Nixon & Vanderhye

[57] ABSTRACT

An image forming apparatus includes a pressure development unit having a pair of press rollers, an eccentric cam for regulating the pressure, and a power transmission unit for transmitting a driving force to the eccentric cam, in which the power transmission unit includes a one-way clutch providing only one directional path for the power transmission.

9 Claims, 6 Drawing Sheets

IMAGE FORMING APPARATUS WITH A PRESSURE DEVELOPMENT UNIT

BACKGROUND OF THE INVENTION

1. Field of the invention

The present invention relates generally to an image forming apparatus in which a latent image is developed under pressure, and more particularly to a pressure developing device for use in an image forming apparatus, the device being capable of applying an appropriate pressure to various sheet sizes.

2. Description of the prior art

Japanese Laid-Open Patent Publication No. 63-92954 discloses a pressure developing apparatus having high pressure rollers in which the pressure is stopped by means of an eccentric cam. The rotation of the eccentric cam effects the applying and stopping of pressure. After the pressure is stopped, an operator can remove jams and clean and repair mechanical parts around the rollers. Especially when a sheet is caught in the feed rollers, the applying of pressure must immediately be stopped. Otherwise, the applying torque will change suddenly.

However, the eccentric cam has a drawback in that it starts to rotate if it is stopped in an unstable posture. It is dangerous if the eccentric cam starts to rotate and adds pressure while an operator is engaged in cleaning or repair work. For example, in the case of press rollers having a diameter of 20 cm, a high pressure such as 2 tons is usually applied to both ends of the roller. When a sheet is passed through the rollers, the problem is that the pressure varies in the direction of the axis of the roller depending upon the sheet size (i.e. the widths of a sheet perpendicular to the feed direction). More specifically, when the sheet has a reduced size, it passes through the central part of the rollers so that the surfaces of the rollers are warped The warped roller surfaces cause an uneven distribution of pressure in the axial direction of the rollers. The uneven distribution of pressure results in uneven development and causes fatal wrinkles in the sheet.

Another problem is that the pressure varies per unit picture line in accordance with variations in the sheet sizes, thereby resulting in unstable color densities and poor quality of the pictures.

SUMMARY OF THE INVENTION

The image forming apparatus of the present invention, which overcomes the above-discussed and numerous other disadvantages and deficiencies of the prior art, comprises a pressure development unit comprising a pair of press rollers, an eccentric cam for regulating the pressure, and a power transmission unit for transmitting a driving force to the eccentric cam, wherein the power transmission unit comprises a one-way clutch providing only one directional path for the power transmission.

According to a further aspect of the present invention, an image forming apparatus comprises a pressure development unit comprising a pair of press rollers, an eccentric cam for regulating the pressure, and a power transmission unit for transmitting a driving force to the eccentric cam, the power transmission unit comprising a one-way clutch providing only one directional path for the power transmission, means for inputting the size of a sheet passing through the press rollers, and means for determining the amount of rotation of the eccentric cam in accordance with input based on the size of the sheet.

In a preferred embodiment, the image forming apparatus further comprises at least three sheet storing sections including a manual insertion section, each storing section comprising a sensor for detecting the sheet size stored therein, the sensor signaling the detected result to a control system for determining the amount of rotation of the eccentric cam through a clutch.

Thus, the invention described herein makes possible the objectives of (1) applying an appropriate pressure for the sheet size to the press roller, thereby avoiding the formation of wrinkles in the sheets, the poor formation of an image and the occurrence of jams, (2) equalizing the distribution of pressure in the axial direction of the press rollers, and (3) stabilizing the color density per unit picture line irrespective of varying sheet sizes.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 6:
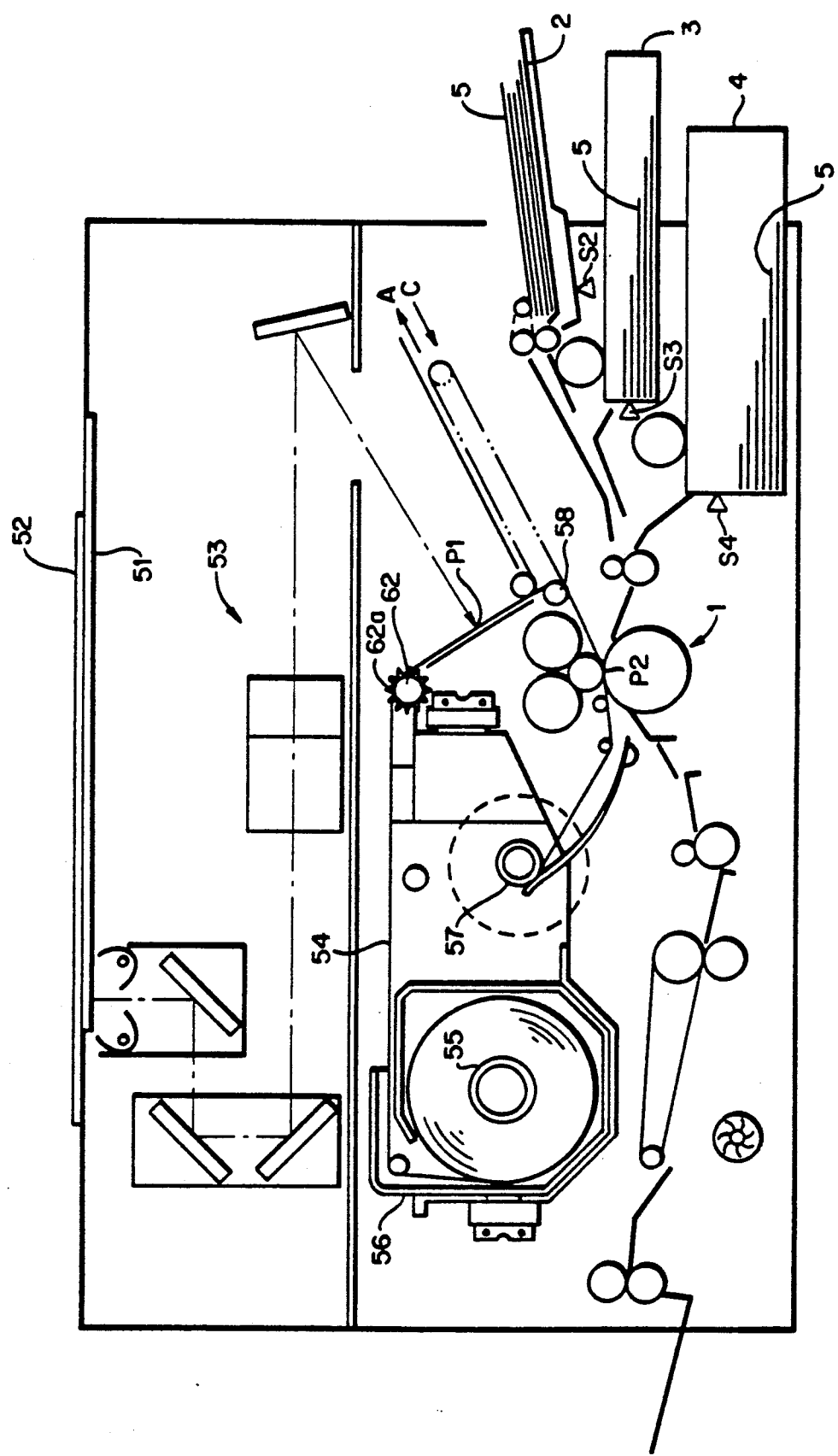
FIG. 6 is an overall view showing the image forming apparatus of the present invention.

Referring to FIG. 6, there is shown by way of example an image forming apparatus which incorporates a pressure developing apparatus. The image forming apparatus is provided with an original platen 51 of transparent glass. An original 52 is placed face down on the platen 51. Under the platen 51 are disposed an optical system 53 including a light source, a mirror and lenses. The original 52 on the platen 51 is scanned by the optical system 53, and the light passing through the original 52 is led to an exposure point. The optical system 53 and the exposure point will be more specifically described below.

The image forming apparatus is provided with a sheet loading section on which a photosensitive sheet 54 is loaded. The photosensitive sheet 54 is made of a light-reflective substance such as aluminum foil, coated with pressure-rupturable capsules containing a chromogenic material and color dyestuff having a grain size of 10 to 20 $\mu$m. The pressure-rupturable capsules harden by exposure to light, and rupture under pressure to allow the color dyestuff to flow out. The photosensitive sheet 54 constitutes a photo-and-pressure sensitive sheet together with an image receiving sheet 5 referred to below. The image receiving sheet 5 will hereinafter be referred to as the receiving sheet.

The photosensitive sheet 54 is wound around a roll 55 which is housed in a light impermeable cartridge 56 so as to be safe from light and pressure. The photosensitive sheet 54 is pulled from the cartridge 56 and wound around a roller 57 by way of an exposure point P1, a buffer roller 58 and a pressure development point P2 formed by a nip between two rollers. The buffer roller 58 is moved in the direction of arrow (A) at the time of exposure so as to pull the exposed sheet 54 in the right-hand direction and stay in this posture for some time. When pressure development is to be performed, the photosensitive sheet 54 is pulled by a pressure development unit 1 and fed to the pressure development point P2. In this way after the exposure is finished, the pressure development process is started.

Figure 3:
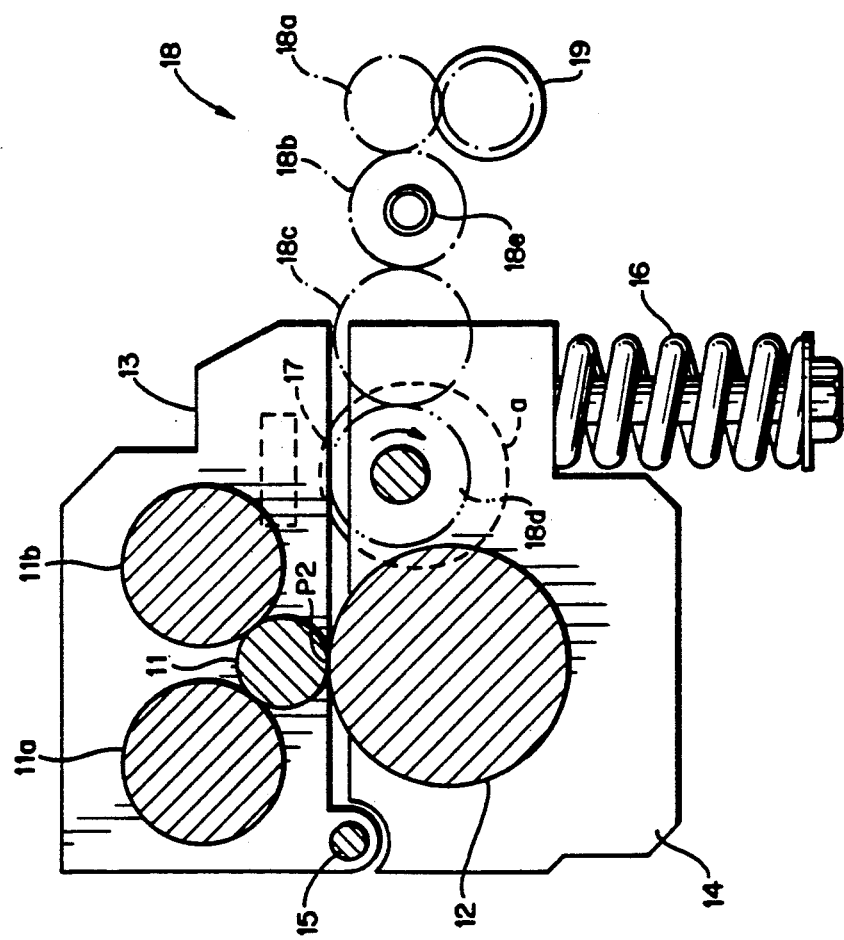
FIG. 3 is a cross-sectional view showing the pressure development unit incorporated in the image forming apparatus of the present invention.
Figure 4:
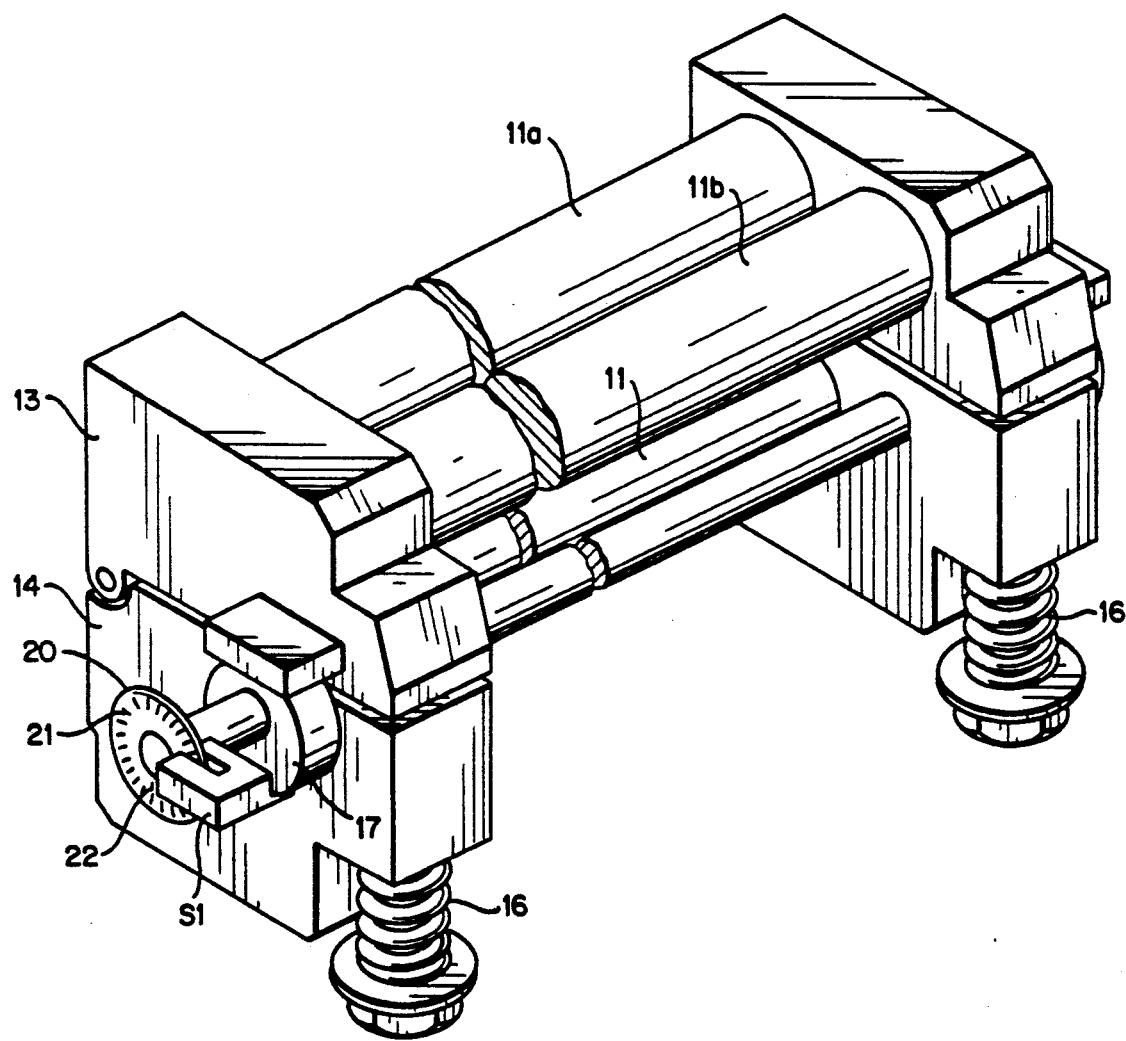
FIG. 4 is a perspective view showing the pressure development unit on an enlarged scale.

Referring now to FIGS. 3 and 4, the pressure development unit 1 will be described in detail:

The pressure development unit 1 includes an upper press roller 11 and a lower press roller 12 having the pressure development point P2 therebetween. The upper press roller 11 is mounted on an upper holder 13 in such a manner as to be vertically movable against rotary back-up rollers 11a, 11b. The lower press roller 12 is mounted on a lower holder 14 for rotation. The upper and lower holders 13, 14 can rotate about a shaft 15. The applying and stopping of pressure are controlled by springs 16 and an eccentric cam 17. When the upper and lower holders 13 and 14 are placed under pressure, the press rollers 11 and 12 are also placed under pressure. When the upper and lower holders 13 and 14 are released from pressure, the press rollers 11 and 12 are also released from pressure. The press rollers 11 and 12 are placed under pressure only when the pressure development is to be carried out, but at other times they are released from pressure.

The eccentric cam 17 is driven by a main motor 19 through a transmission unit 18 which includes gears 18a to 18d and a one-way clutch 18e. The one-way clutch 18e prevents the gears 18a to 18d and the eccentric cam 17 from reversing. As shown in FIG. 4, the shaft of the eccentric cam 17 is provided with a disc 20 having slits 21 radially formed. The slits 21 are monitored by a sensor S1 so as to measure the rotational amount (amount of rotation) of the eccentric cam 17. A further slit 22 is formed inside the circle defined by the slits 21. The second slit 22 corresponds to the position (a) of the major diameter of the eccentric cam 17 and is monitored by the sensor S1 to determine the reference position for the rotation of the eccentric cam 17.

Figure 2A:
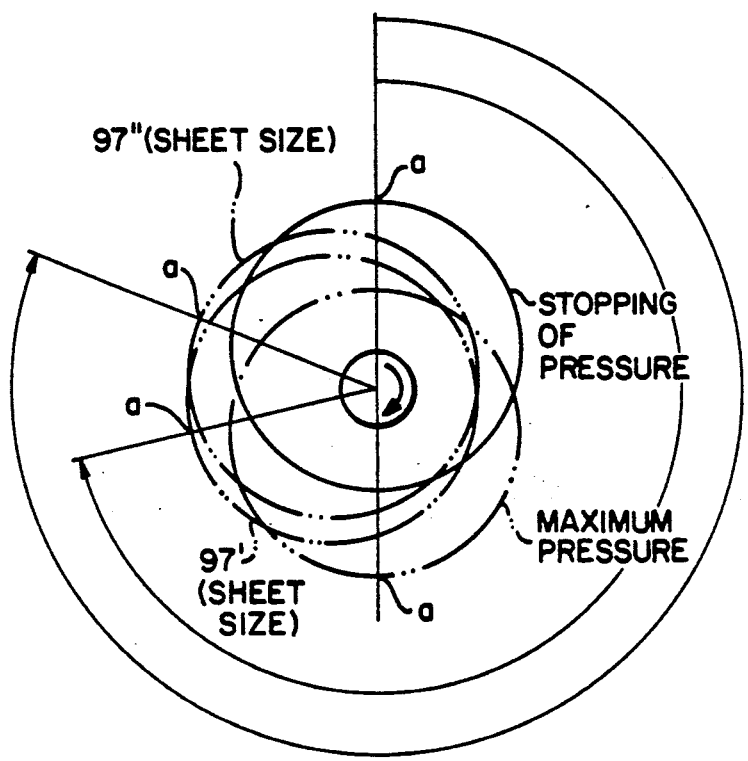
FIGS. 2A and 2B are a diagrammatic view showing the state of rotation of an eccentric cam incorporated in the image forming apparatus of the present invention, and a graph showing the relation between the sheet sizes and the amount of rotation of the eccentric cam, respectively.
Figure 2B:
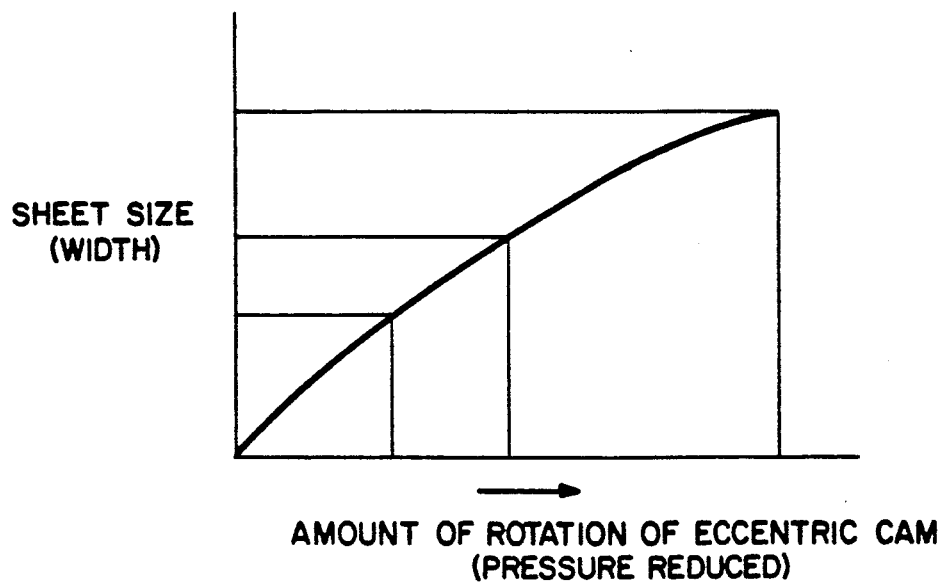

FIG. 2A shows the state of rotation of the eccentric cam 17:

When no pressure is applied to the pressure development unit 1, the eccentric cam 17 is positioned as shown in the full lines in FIG. 2A where the major diameter position (a) is located on top. When the pressure development is performed, the eccentric cam 17 is rotated to adjust the pressure. More specifically, when the position (a) is located at bottom, the maximum pressure is reached. As it continues to rotate from the position (a) at the bottom, the pressure diminishes toward zero from the state 97' through a state 97". When the eccentric cam 17 is at the positions 97', 97" it becomes unstable. However, owing to the presence of the one-way clutch 18e the eccentric cam 17 is kept safe from reversing even if it is stopped in such an unstable posture. The large number of gears in the power transmission unit 18 ensures the stability of the eccentric cam 17. FIG. 2B is a graph showing the relationship between the amount of rotation of the eccentric cam 17 and the sheet sizes (widths of sheet). It will be understood from the graph that as the sheet sizes reduce, the rotational speed of the eccentric cam 17 is increased, thereby reducing the pressure upon the press rollers. If a large pressure is applied for a sheet of a relatively small size, the press rollers 12 and 11 tend to warp, thereby wrinkling the sheet and/or leading to uneven development.

In FIG. 6 the image forming apparatus is provided with a manual insertion tray 2 and sheet cassettes 3 and 4 in which the receiving sheets 5 are stacked. There is provided a sheet size sensor S2 on the underside of the manual insertion tray 2. The cassettes 3, and 4 are provided with sensors S3 and S4, respectively, which detect the sizes of the sheets stored are detected. When the pressure development is to be performed, the receiving sheet 5 is supplied to the pressure development unit 1 from the manual insertion tray 2 or the cassette 3 or 4 selected in response to an input from an operation panel 34.

Figure 5:
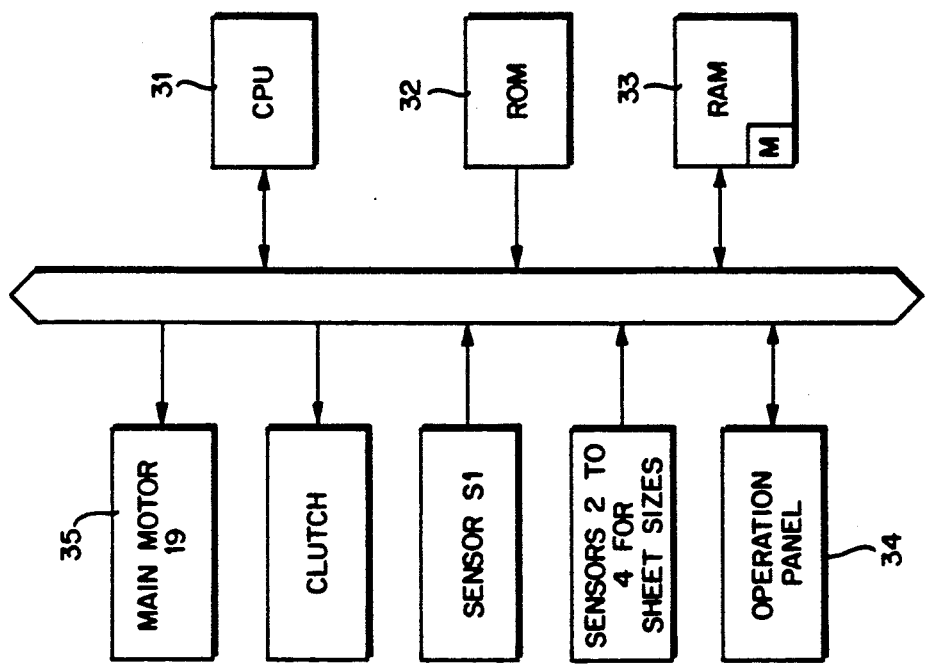
FIG. 5 is a block diagram showing a control system of the image forming apparatus.

As shown in FIG. 5, the image forming apparatus is controlled by a central processing unit (CPU) 31 which reads data from the sensors S1, S2, S3, S4, and the operation panel 34, in accordance with a program stored in a ROM 32, and controls the main motor 19, clutch 35 and others on the basis of the data. The clutch 35, when engaged, transmits a driving force of the main motor 19 to the power transmission unit 18 of the eccentric cam 17. A RAM 33 stores the amount of rotation of the eccentric cam 17 corresponding to the sheet sizes stored in a memory area M. When the pressure is adjusted for the eccentric cam 17, the CPU 31 reads data from the memory area M and the clutch 35 is accordingly engaged or disengaged.

Figure 1A:
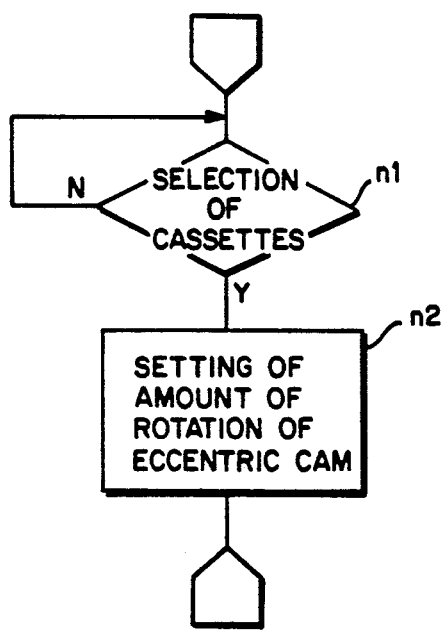
FIGS. 1A and 1B are flowcharts showing the process to be performed by the image forming apparatus according to the present invention.
Figure 1B:
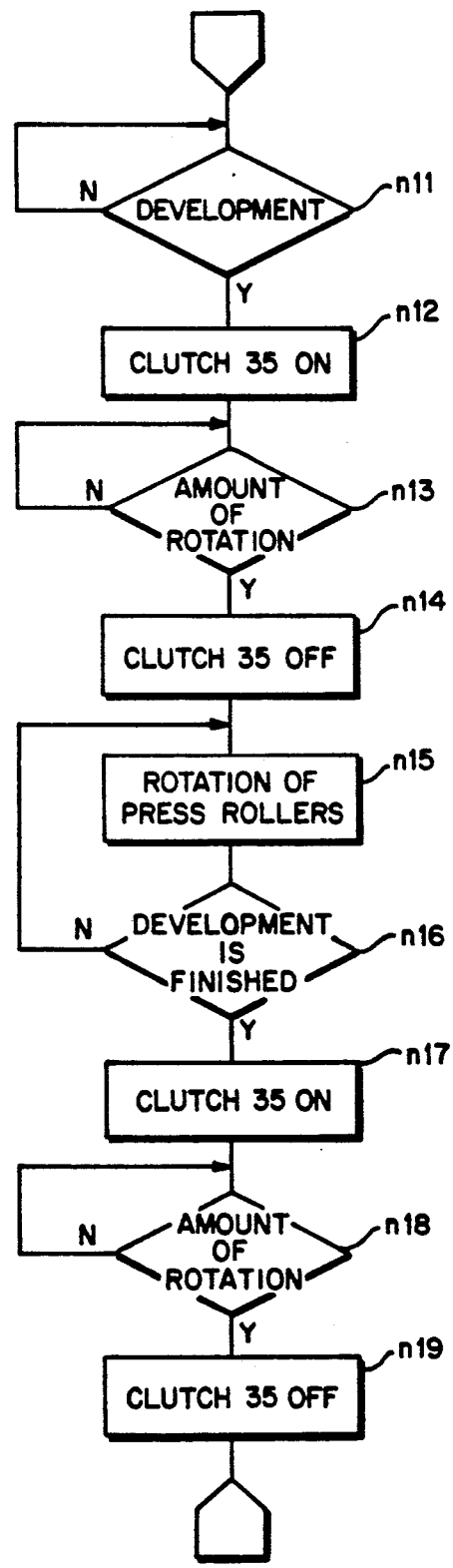
Figure 7:
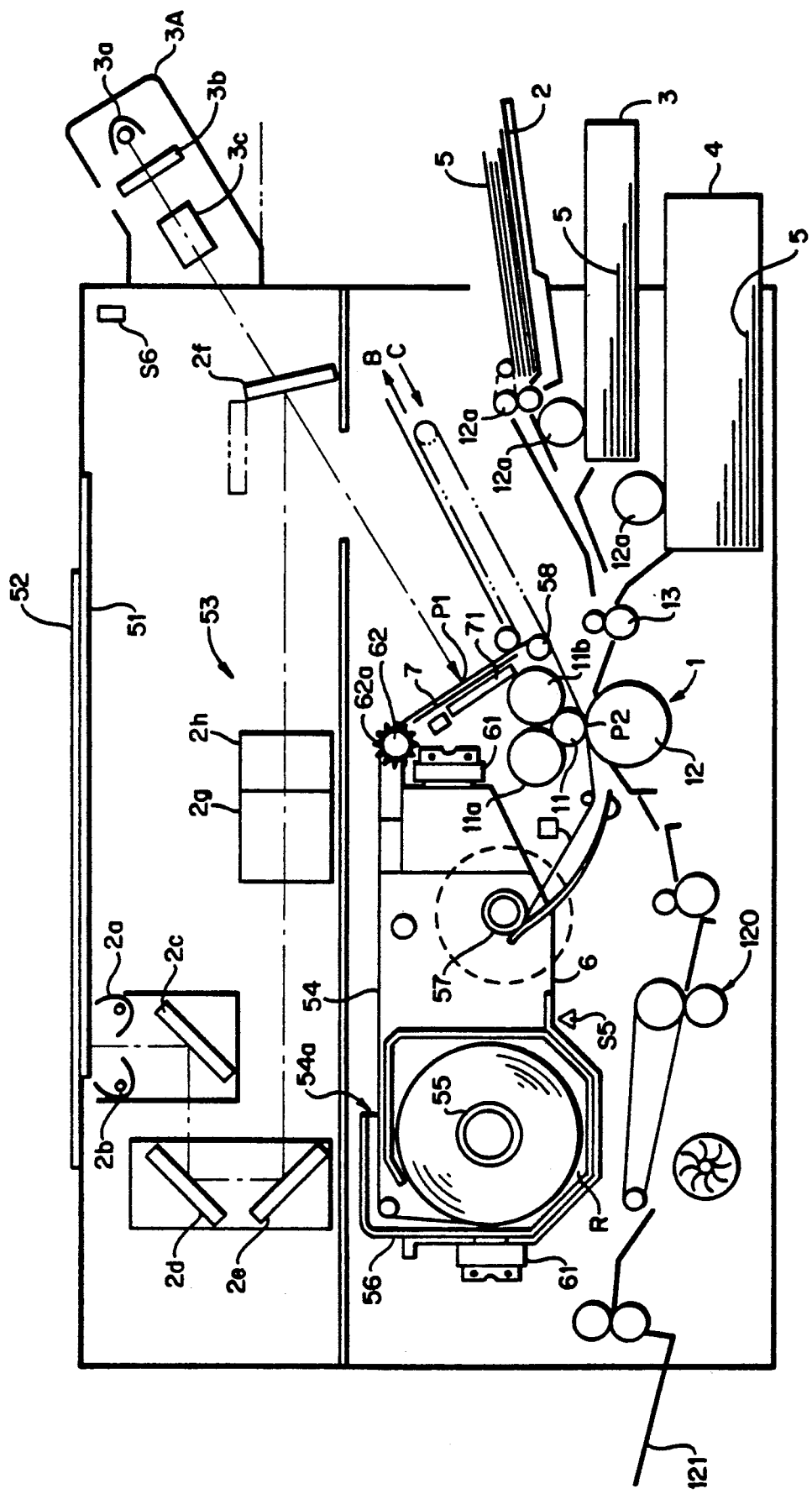
FIG. 7 is an overall view showing another example of the image forming apparatus.

Referring to FIG. 1, the process of adjusting the pressure for the eccentric cam 17 will be described:

By operating the operation panel 34 the manual insertion tray 2 or the cassette 3 or 4 is selected. Then the amount of rotation of the eccentric cam 17 is set depending upon the receiving sheet size by reference to the data about the amount of rotations stored in the RAM 33 (steps n1 to n2 as depicted in FIG. 1A). After the exposure is finished in the image formation process, the photosensitive sheet 54 and the receiving sheet 5 are fed (via conventional rollers 12a, 13 as depicted in FIG. 7) together so that the forward end of a latent image on the photosensitive sheet 54 and the forward end of the receiving sheet 5 overlay each other at the pressure development point P2. At this stage the pressure development is initiated. First the clutch 35 is engaged, thereby imparting a driving force to the eccentric cam 17. Thus the eccentric cam 17 rotates by an amount predetermined at step n2 (steps n11 to n14 in FIG. 1B). In this way the photosensitive sheet 54 and the receiving sheet 5 are pressed at an optimum pressure so as to form no wrinkles on the surfaces of the sheets. Finally the press rollers 11 and 12 are to apply pressure to the sheets (steps n15 to n16 in FIG. 1B). When the pressure development is finished, the clutch 35 is again engaged on, thereby releasing the rollers 12 and 11 from pressure (steps n17 to n19).

Referring now to FIG. 7 wherein like numerals refer to like and corresponding parts in FIG. 6, the components referred to above will be more specifically described:

The optical system 53 includes light sources 2a, 2b, mirrors 2c to 2f, and a lens 2g, a filter unit 2h. The filter unit 2h is composed of a plurality of filters having different light-permeable wavelengths. The number of filters can be changed by addition or removal so as to effect chromatic compensation. The number of filters depends on the sensitivity of the photosensitive sheet 54 and the image color density desired by the user.

Preferably, the image forming apparatus is provided with a slide projector 3A detachably mounted. The slide projector 3A includes a light source 3a, a holder 3b, and a lens 3c. The holder 3b maintains slides to be printed. The mirror 2f can be rotated approximately at 90°, as shown in phantom lines, by means of a handle (not shown) disposed in a front side of the image forming apparatus. When the mirror 2f is shifted at 90° as shown in phantom lines, a light from the source 3a is led to the exposure point P1 through a slide placed on the holder 3b and the lens 3c. Additional filters can be provided in the lens 3c for chromatic compensation.

Preferably the cartridge 56 is detachably fitted in a bucket 6 which is releasably retained by bucket holders 61. The reference numeral 62 denotes sprockets having teeth 62a. When a fresh cartridge 56 is loaded in a chamber R, the top end of the photosensitive sheet 54 is pulled out through an opening 54a until it is engaged with the sprockets 62. Normally the starting end of the photosensitive sheet 54 is provided with a lead sheet which is less pliable and slightly wider than the photosensitive sheet 54. The lead sheet has holes at opposite edges in which the sprocket teeth 62a fit. When the lead sheet is engaged with the sprockets 62 and the bucket 6 is loaded in the image forming apparatus, a sensor S5 is on, and when a cover is closed over the apparatus, a sensor S6 is on. When the two sensors S5 and S6 are on, it means that the automatic loading of the photosensitive sheet 54 is finished.

At the exposure section there is provided an exposure plate 7 and a heater 71 which is turned on at the time of exposure. The heater 71 is designed to maintain the photosensitive sheet 54 at a constant temperature so as to prevent the photosensitivity thereof from varying in accordance with varying temperatures.

As shown in FIG. 7 the image forming apparatus is preferably provided with a brightening device 120 which heats and presses the receiving sheet 5 bearing an image. With the heat the resin on the receiving sheet 5 becomes fluid and spreads over the surface thereof to cover it as a film. The film provides a polished, smooth surface. In addition, the heat accelerates the coloring action. The finished receiving sheet 5 is discharged through an outlet 121.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. An image forming apparatus which comprises a pressure development unit comprising a pair of press rollers, an eccentric cam for regulating the pressure applied to the press rollers, and a power transmission unit for transmitting a driving force to the eccentric cam, wherein the power transmission unit comprises a one-way clutch providing only one directional path for the power transmission and one direction of movement of said cam.

2. An image forming apparatus which comprises a pressure development unit comprising a pair of press rollers, a rotary eccentric cam for regulating the pressure, and a power transmission unit for transmitting a driving force to the eccentric cam to rotate said cam in one direction, the power transmission unit comprising a one-way clutch providing only one directional path for the power transmission and preventing rotation of said cam in the opposite direction, means for inputting the size of a sheet passing through the press rollers, and means for determining the amount of rotation of the eccentric cam in accordance with the input based on the size of the sheet.

3. An image forming apparatus according to claim 1, wherein said cam is a rotary cam, and further comprising at least three sheet storing sections including a manual insertion storing section, each storing section comprising a sensor for detecting the sheet size stored therein, said sensor signalling the detected result to a control system which determines the magnitude of rotation of the eccentric cam through a clutch, said cam being operable to continuously vary the pressure applied to said press rollers in response to rotation of said cam in said one direction.

4. An image forming apparatus according to claim 1, further comprising a sheet storing section comprising a sensor for detecting the sheet size stored therein, the sensor signaling the detected result to a control system which determines the amount of movement of said eccentric cam through said clutch, said cam being rotatable, said clutch enabling rotary movement of said cam in one direction only.

5. An image forming apparatus according to claim 2, further comprising at least three sheet storing sections including a manual insertion storing section, each storing section comprising a sensor for detecting the sheet size stored therein, said sensor signalling the detected result to said control system which determines the magnitude of rotation of the eccentric cam through a clutch, said cam being operable to continuously vary the pressure applied to said press rollers in response to rotation of said cam in said one direction.

6. An image forming apparatus according to claim 4, wherein said cam is operable to continuously vary the pressure applied to said press roller in response to rotation of said cam in said one direction.

7. An image forming apparatus according to claim 6, further comprising at least three sheet storing sections including a manual insertion storing section, each storing section comprising a sensor for detecting the sheet size stored therein, said sensor signalling the detected result to said control system which determines the amount of rotation of the eccentric cam through a clutch.

8. An image forming apparatus comprising:
    a pair of press rollers in a pressure image development unit;
    plural differently sized sheet feeding units for selectively feeding a sheet of selected size into the press rollers; and
    means for controlling the pressure exerted by said press rollers as a function of the selected sheet size;
    said control means including a cam and a clutch for driving said cam for movement in one direction only to continuously vary the pressure applied to said press rollers in response to movement of said cam in said one direction.

9. An image forming apparatus according to claim 8, wherein said cam is rotatable.

* * * * *